United States Patent
Bachrach et al.

(10) Patent No.: US 6,896,513 B2
(45) Date of Patent: May 24, 2005

(54) LARGE AREA SUBSTRATE PROCESSING SYSTEM

(75) Inventors: Robert Z. Bachrach, Burlingame, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/243,158

(22) Filed: Sep. 12, 2002

(65) Prior Publication Data

US 2004/0053184 A1 Mar. 18, 2004

(51) Int. Cl.[7] .............................................. F27B 13/00
(52) U.S. Cl. ............................. 432/121; 432/5; 432/11; 118/719; 118/724; 118/725; 414/935; 414/937; 414/940
(58) Field of Search ............................. 432/121, 5, 11; 219/390, 405, 411; 392/416; 118/719, 724, 725; 414/217, 935, 936, 937, 939, 940, 941

(56) References Cited

U.S. PATENT DOCUMENTS

| | | | |
|---|---|---|---|
| 4,819,496 A | 4/1989 | Shelef .......................... 74/479 |
| 5,636,964 A | 6/1997 | Somekh et al. .............. 414/786 |
| 5,993,141 A | 11/1999 | Wytman ................... 414/744.2 |
| 6,026,703 A | 2/2000 | Stanisic et al. ........... 74/490.06 |
| 6,069,420 A | 5/2000 | Mizzi et al. ........... 310/40 MM |
| 6,142,722 A | * 11/2000 | Genov et al. ................ 414/217 |
| 6,176,668 B1 | 1/2001 | Kurita et al. ................ 414/217 |
| 6,270,582 B1 | * 8/2001 | Rivkin et al. ................ 118/719 |
| 6,312,525 B1 | 11/2001 | Bright et al. ................ 118/719 |
| 6,371,713 B1 | 4/2002 | Nishimura et al. ....... 414/22.13 |
| 6,379,095 B1 | 4/2002 | Elliott et al. ................. 414/279 |
| 6,530,993 B2 | 3/2003 | Hwang et al. |
| 2002/0005168 A1 | 1/2002 | Kraus et al. ................. 118/715 |
| 2002/0061248 A1 | 5/2002 | Tepman ................... 414/744.5 |

FOREIGN PATENT DOCUMENTS

| | | | | |
|---|---|---|---|---|
| EP | 1189275 | | 3/2002 | ........... H01L/21/68 |
| JP | 09246347 A | * | 9/1997 | ........... H01L/21/02 |
| JP | 09283590 A | * | 10/1997 | ........... H01L/21/68 |
| WO | WO02/056349 | | 7/2002 | ........... H01L/21/00 |

OTHER PUBLICATIONS

U.S. Appl. No. 09/505,901, filed Feb. 17, 2002, Fairbairn.
International Search Report PCT/US03/28813, dated May 7, 2004 (APPM/7037PCT).

* cited by examiner

*Primary Examiner*—Jiping Lu
(74) *Attorney, Agent, or Firm*—Moser, Patterson & Sheridan, LLP (57) ABSTRACT

A system and method for processing large area substrates is provided. In one embodiment, a processing system includes a transfer chamber having at least one processing chamber and a substrate staging system coupled thereto. The staging system includes a load lock chamber having a first port coupled to the transfer chamber and a heat treating station coupled to a second port of the load lock chamber. A load lock robot is disposed in the load lock chamber to facilitate transfer between the heat treating station and the load lock chamber.

34 Claims, 9 Drawing Sheets

LARGE AREA SUBSTRATE PROCESSING SYSTEM

BACKGROUND OF THE INVENTION

1. Field of the Invention

Embodiments of the present invention generally relate to a large area substrate processing system having a transfer robot.

2. Description of the Related Art

Thin film transistors (TFT) are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass processing equipment is generally configured to accommodate substrates up to about one square meter. Processing equipment configured to accommodate substrate sizes up to and exceeding 1½ square meters is envisioned in the immediate future.

Equipment to fabricate such large substrates represents a substantial investment to flat panel display fabricators. Conventional systems require large and expensive hardware. For example, the increase volume requires vacuum pumps having higher capacities while port sealing apparatus must be enhanced to accommodate larger sealing forces due to the larger passages needed to accommodate larger substrates. Additionally, due to their large capital costs, typical large substrate processing systems have many processing chambers coupled to a central transfer chamber in order to maximize process flexibility for a given tool foot print.

However, this increased equipment size and cost represents a substantial problem for fabricators having limited factory space available for such equipment. Moreover, fabricators seeking to perform a limited number of process steps are disadvantageously required to utilize equipment having capacities, process capability and size much greater than required to perform limited processing on large area substrates.

Therefore, there is a need for compact processing equipment for large area substrates.

SUMMARY OF THE INVENTION

A system and method for processing large area substrates is provided. In one embodiment, a processing system includes a transfer chamber having attached at least one processing chamber and a substrate staging system coupled thereto. The staging system includes a load lock chamber having a first port coupled to the transfer chamber and a heat treating station coupled to a second port of the load lock chamber. A load lock robot is disposed in the load lock chamber to facilitate transfer between the heat treating station and the load lock chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1A:
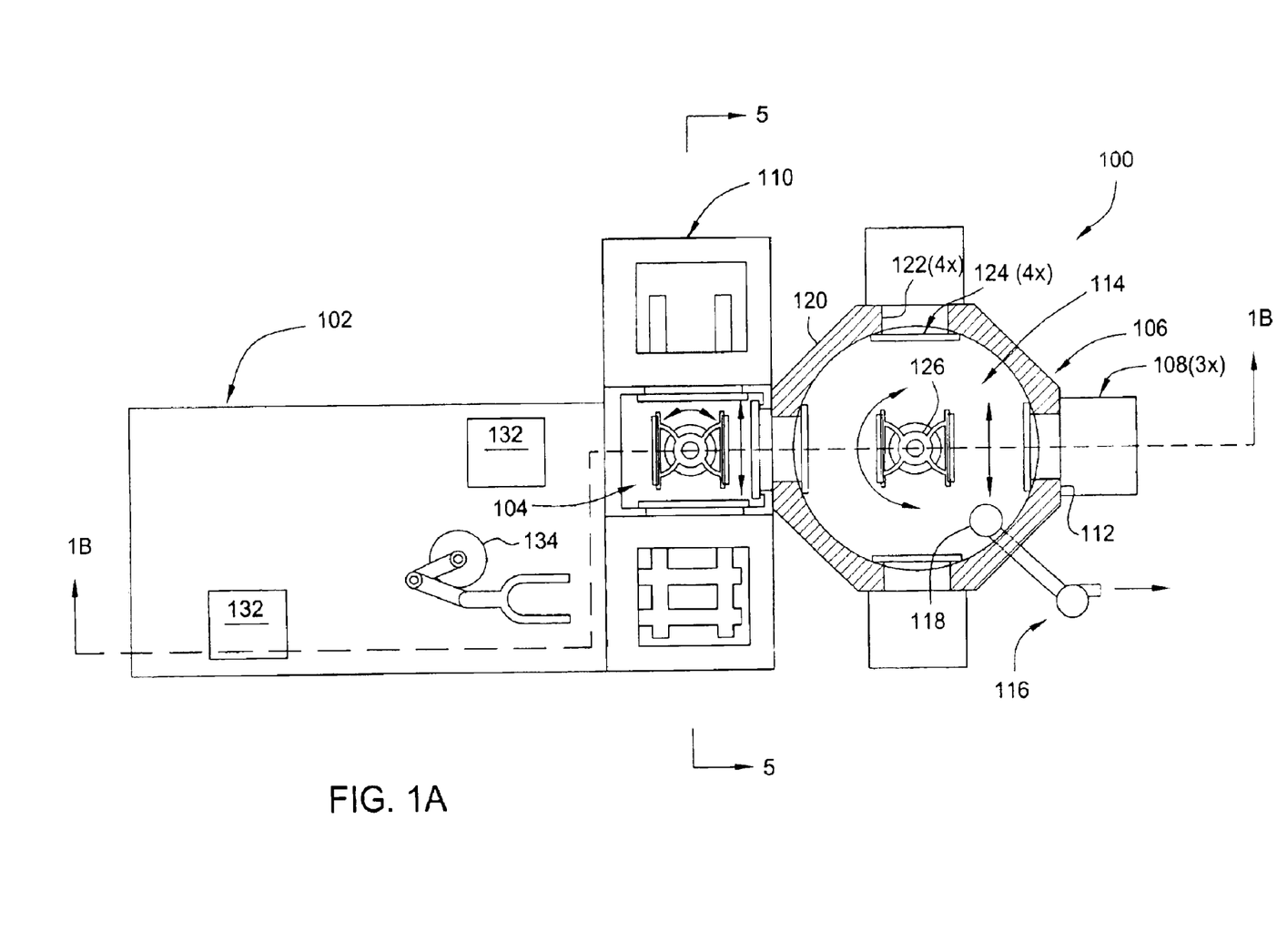
FIG. 1A is a top plan view of one embodiment of a processing system for processing large area substrates.
Figure 1B:
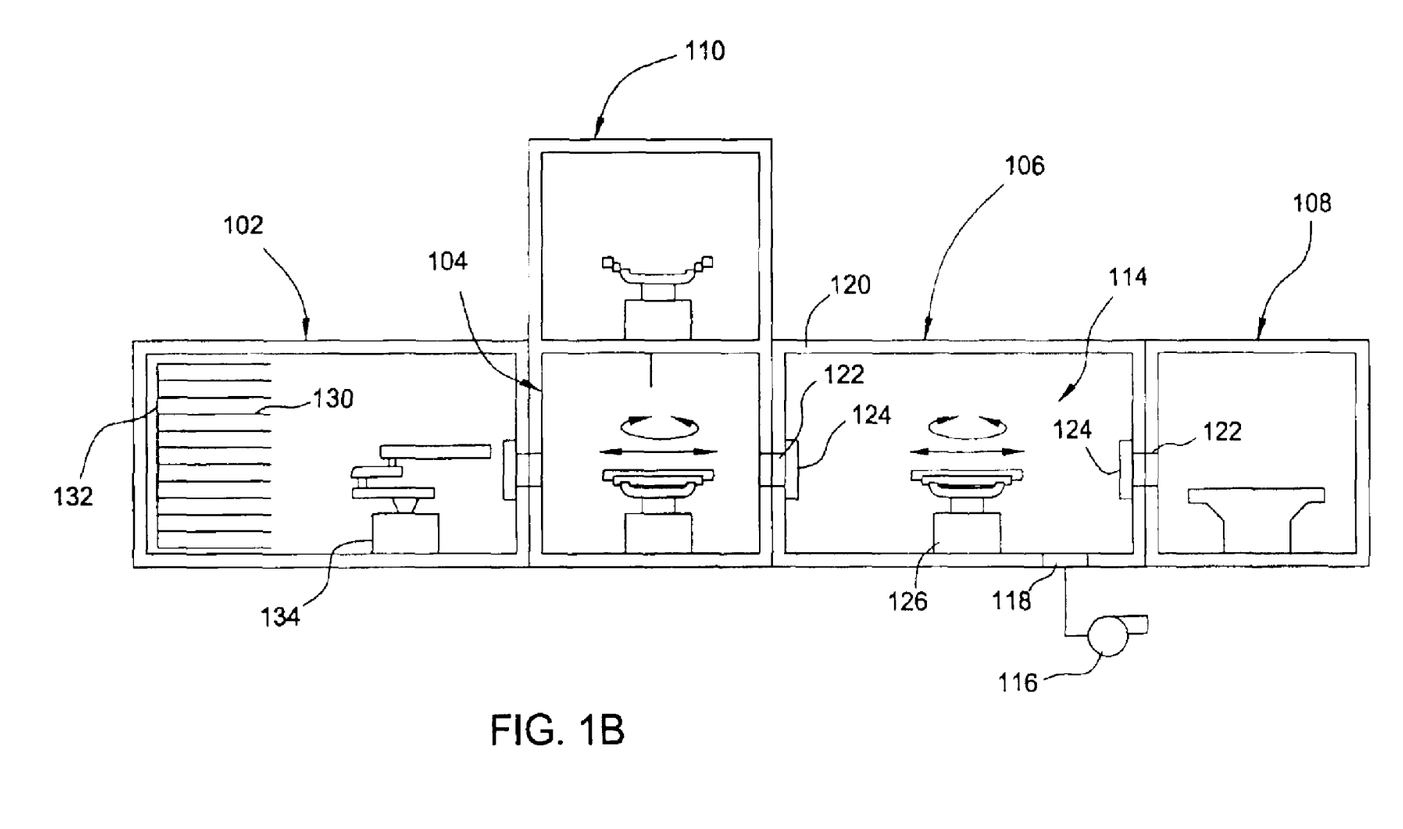
FIG. 1B is a sectional view of the processing system of FIG. 1A.

FIGS. 1A–B is a top plan view and a sectional view of one embodiment of a large area substrate processing system 100. The processing system includes a factory interface 102 coupled by a load lock chamber 104 to a transfer chamber 106 that has at least one processing chamber 108 coupled thereto. The load lock chamber is part of a staging system 110 adapted to queue and/or thermally treat or otherwise condition substrates being transferred between the factory interface 102 and the transfer chamber 106. The factory interface 102 has any number of configurations, and typically includes at least one substrate storage cassette 132 and an interface transfer robot 134 for transferring substrates 130 between the cassettes 132 and the staging system 110.

The transfer chamber 106 has a chamber body 120 that is typically fabricated from a suitable material such as aluminum, stainless steel, or polypropylene. The transfer chamber may be rectangular or circular cross-section as depicted here. The transfer chamber includes a plurality of facets 112 on its external walls that facilitate coupling the processing chambers 108 or other chambers to the transfer chamber 106. The interior of the transfer chamber 106 defines an evacuable or controlled atmosphere volume 114 coupled to a circulation or pumping system 116 through an exhaust port 118 disposed through the chamber body 120. A plurality of substrate access ports 122 are formed through the chamber body 120 to facilitate entry and egress of substrates into the internal volume 114 of the transfer chamber 106. The access ports 122 are selectively sealed by slit valves 124 that enable the environment of the transfer chamber 106 to be selectively isolated. One slit valve that may be adapted to benefit from the invention is described in U.S. Pat. No. 6,079,693, issued Jun. 27, 2000 to Ettinger et al., which is hereby incorporated by reference in its entirety.

At least one processing chamber 108 and at least one load lock chamber 104 are coupled to the chamber body 120. The processing chambers may be configured to perform chemical vapor deposition, physical vapor deposition, thermal treatment, plating or other process associated with integrated circuit fabrication on a semiconductor substrate. Such chambers are available from Applied Materials, Inc. of Santa Clara, Calif.

A transfer robot 126 is disposed in the interior volume 114 of the transfer chamber 106 and is adapted to transfer substrates between the processing chambers 108 and the load lock chamber 104. The transfer robot 124 may be any robot suitable for large area substrate transfer in a vacuum environment and execute a variety of motions.

Figure 2:
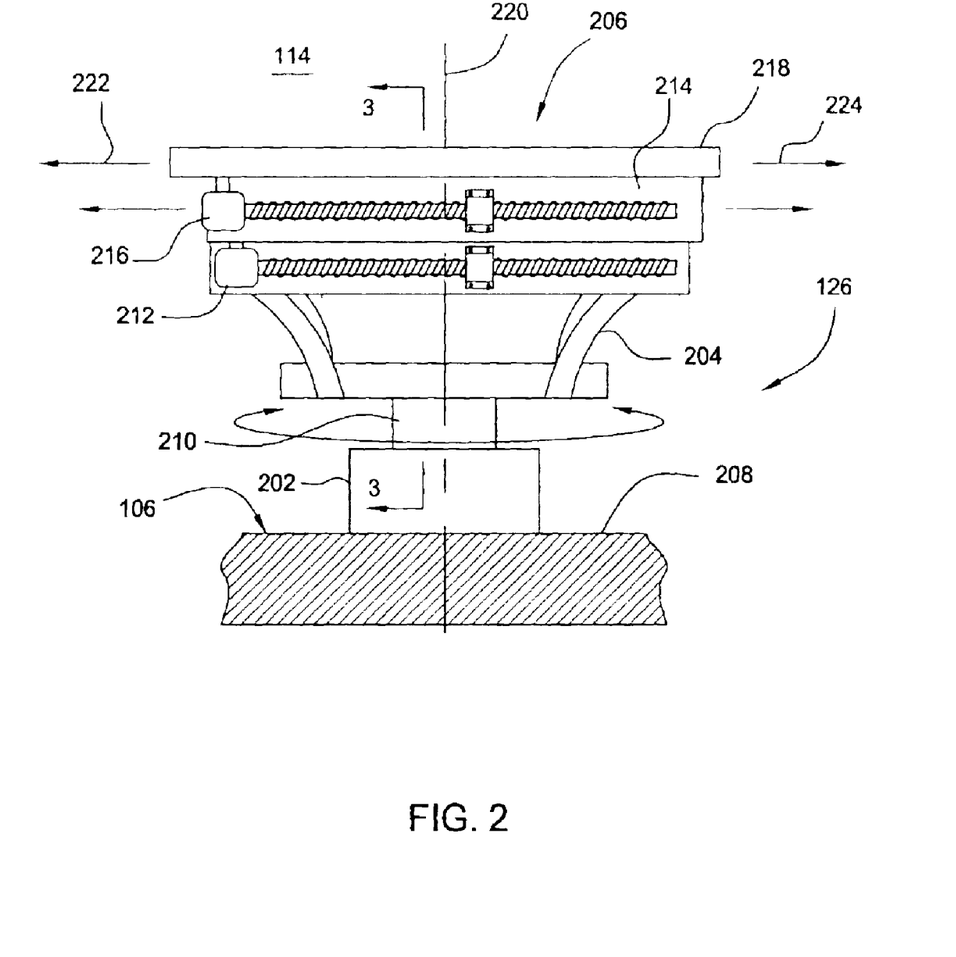
FIG. 2 is a is a side view of one embodiment of a transfer robot.

FIG. 2 is a side view of one embodiment of the transfer robot 126. The transfer robot 126 includes a body 202, a bracket 204 and a linkage assembly 206. The body 202 is centrally coupled to a bottom 208 of the transfer chamber 106 and typically houses a motor (not shown) that is utilized to rotate the bracket 204 and linkage assembly 206. Rotating the substrate on its center advantageously allows a minimum system size to be realized.

The bracket 204 couples the linkage assembly 206 to the body 202. In the embodiment depicted in FIG. 2, the bracket 204 is coupled to the body 202 by a shaft 210 that may be rotated relative to the body 202 to orientate the transfer robot 126 to facilitate substrate exchange with any of the surrounding chambers. Optionally, the shaft 210 may be extended and retracted from the body 202 to control the elevation of the bracket 204 and linkage assembly 206.

The linkage assembly 206 generally includes a first actuator 212, a stage 214, a second actuator 216 and an end-effector 218. The first actuator 212 is adapted to move the stage 214 relative to the bracket 204. The second actuator 216 is adapted to move the end-effector 218 relative to the stage 214. The end-effector 218 is adapted to support the substrate (not shown in FIG. 2) while being transported by the transfer robot 126.

Figure 3:
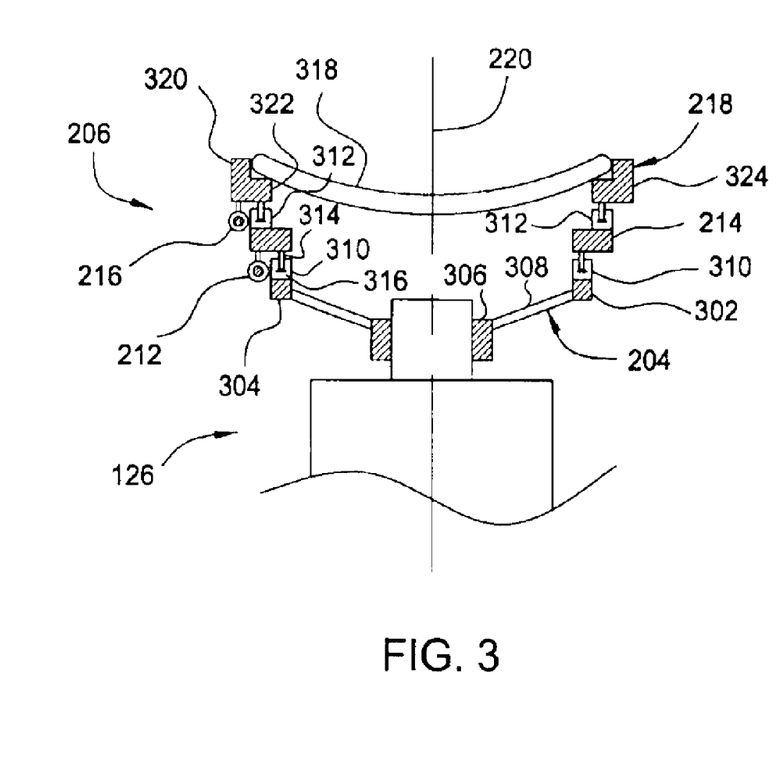
FIG. 3 is a sectional view of the transfer robot taken along section lines 3—3 of FIG. 2.

FIG. 3 depicts a sectional view of the transfer robot 126 supporting a substrate 318 taken along section lines 3—3 of FIG. 2. In one embodiment, the end-effector 218 includes a pair of substrate supports 324. Each substrate support 324 includes a first or upper flange 320 coupled to a second or lower flange 322. The upper flanges 320 are disposed in a spaced-apart relation configured to capture the substrate 318 there between, thus preventing the substrate 318 from falling off of the robot 126 during substrate transfer. The lower flanges 322 extend radially inward from the upper flanges 320 to support the substrate 320. The end-effector 218 is fabricated or coated with a material that prevents or minimizes scratching of the substrate, for example, aluminum with polished stainless steel or plastic support pads.

The bracket 204 includes a pair of flanges 302, 304 coupled to a hub 306 by a plurality of connecting members 308. The bracket 204 is typically fabricated from aluminum or other lightweight material to minimize inertia. The hub 306 is coupled to the shaft 210 extending from the robot body 202. Each flange 302, 304 is coupled to the hub 306 by respective connecting members 308 on opposite sides of the shaft 210. Each flange 302, 304 is typically disposed in a spaced-apart relation, equidistant from the hub 306. The flanges 302, 304 are additionally oriented parallel to each other and oriented perpendicular to the rotational axis of the bracket 204.

In one embodiment, a bearing assembly 310 is mounted between each flange 302, 304 of the bracket 204 and the stage 214. A second bearing assembly 312 is mounted between the stage 214 and the end-effector 218. The bearing assembly 310 facilitates linear movement of the stage 214 relative to the bracket 204 while the second bearing assembly 312 facilitates linear movement of the stage 214 relative to the end-effector 218. In the embodiment depicted in FIGS. 2–3, the bearing assembly 310 is a linear bearing that includes a rail 314 coupled to the stage 214 and one or more guides 316 coupled to the flange 302. The guides 316 typically include rollers or recirculating bearings that enhance the movement of the guide 316 along the rail 314. Alternatively, the bearing assembly 310 may include solid bearings or contactless bearings such as magnetic bearings, fluid bearings and the like. The second bearing assembly 312 is similarly configured.

The first actuator 212 is coupled between the stage 214 and the bracket 204 to control the position of the stage 214 relative to the bracket 204. One or more first actuators 212 may be utilized. The first actuator 212 may comprise any motion-producing device suitable for positioning the stage relative the base. Such actuators include pneumatic cylinders, hydraulic cylinders, ball screws, servo motors, Sawyer motors, stepper motors, solenoids, rodless cylinders, timing belts, rack and pinion arrangements, among other devices suitable for linear actuation. In one embodiment, the first actuator is a MEMS actuator. The stage 214 is typically fabricated from aluminum or other lightweight material suitable for use in the transfer chamber 106.

Figure 4:
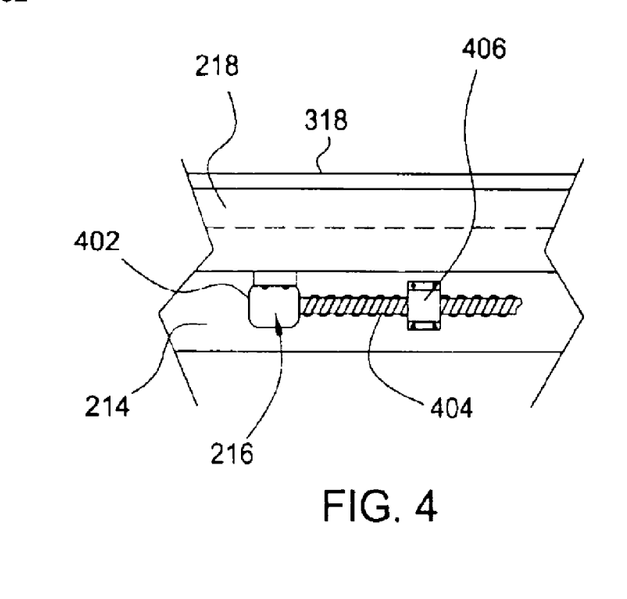
FIG. 4 is a side view of the transfer robot of FIG. 4.

FIG. 4 is a side view of one embodiment of the second actuator 214. The second actuator 214 includes a motor 402 coupled to the end-effector 218 that is adapted to control the rotation of a lead screw 404. A nut 406, engaged with the lead screw 404, is coupled to the stage 214. As the motor 402 of the second actuator 214 rotates the lead screw 404, the nut 406 travels along the lead screw 404, thereby urging the end-effector 218 into motion relative to the stage 214. The first actuator 212 is similarly configured. Thus, the first and second actuators 212, 214 may be energized to linearly extend and retract the end-effector 218 in opposed directions as depicted by arrows 222, 224 through a centerline 220 of the robot 126.

Figure 5:
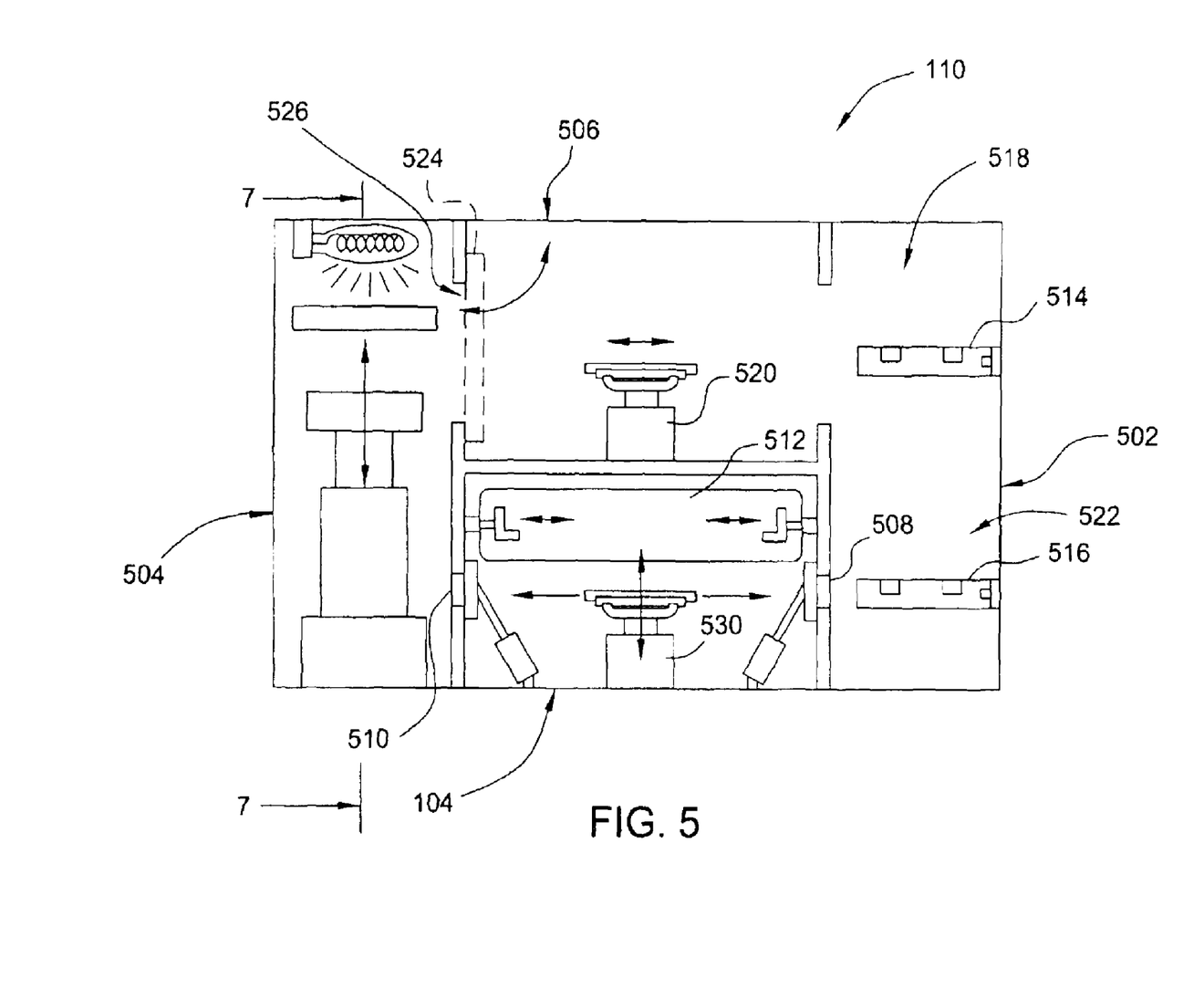
FIG. 5 is one embodiment of the substrate staging system taken along section line 5—5 of FIG. 1A.

FIG. 5 is one embodiment of the substrate staging system taking along section line 5—5 of FIG. 1A. The substrate staging system 110 includes the load lock chamber 104 separating a transfer station 502 and a heat treating station 504. Substrates are generally transferred between the staging system 110 and the factory interface 102 at the transfer station 502. A pass through compartment 506 is disposed above the load lock chamber 104 and includes a pass through robot 520 to facilitate transfer of substrates directly between the transfer station 502 and heat treating station 504 while bypassing the load lock chamber 104. The load lock chamber 104 is configured with three ports 508, 510, 512 that respectively enable substrate transfer to occur between the load lock chamber 104 and the transfer station 502, heat treating station 504 and the transfer chamber 106. Alternatively, the pass through compartment 506 may be mounted below the load lock chamber 104.

In one embodiment, the transfer station 508 includes an input platform 514 and an output platform 516. The input platform 516 is disposed in an upper region 518 of the transfer station 502 and adapted to receive incoming substrates from the factory interface 102. The input platform 516 is typically aligned with the pass through compartment 506 so that substrates disposed on the input platform 516 may be readily transferred through the pass through compartment 506 by the pass through robot 520.

Figure 6:
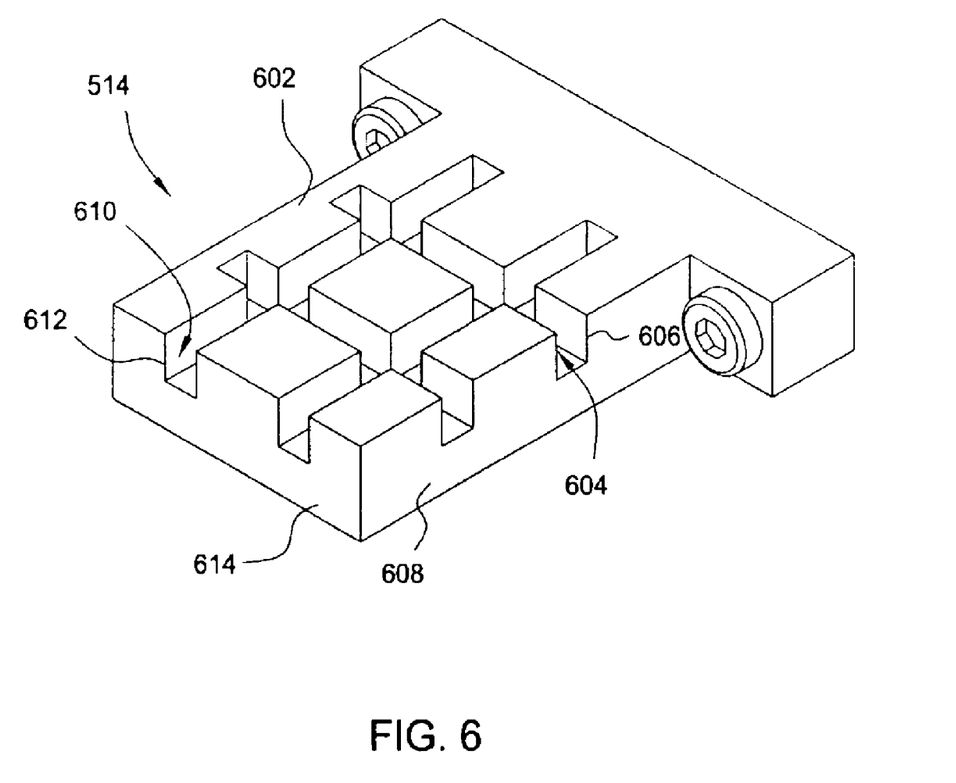
FIG. 6 is a perspective view of one embodiment of an input platform.

FIG. 6 depicts a perspective view of one embodiment of the input platform 514. The input platform 514 includes a top surface 602 adapted to support the substrate having at least one first channel 604 formed therein. In the embodiment depicted in FIG. 6, two first channels 604 are formed in the top surface 602 and have at least a first end 606 open to a first side 608 of the input platform that faces the factory interface 102. The first channels 604 are configured to allow a blade of a factory interface robot 134 (shown in FIGS. 1A–B) to pass between the input platform 514 and the substrate supported thereon to facilitate substrate transfer.

At least one second channel 610 is formed in the top surface of the input platform 514. The second channel 610 is typically orientated orthogonal to the first channel 604 and is adapted to allow the pass through robot 520 to place and retrieve substrates on the input platform 514 of the transfer station 502. In the embodiment depicted in FIG. 6, two second channels 610 are disposed in the top surface 602 of the input platform 514 and have a first end 612 open to a second side 614 of the input platform 514 facing the pass through compartment 506 and load lock chamber 104. The second channels 610 are configured to facilitate substrate exchange between the input platform 514 and the pass through robot 520. Alternatively, the input platform 514 may include one or more lift pins or other elements adapted to selectively or maintain the substrate in a spaced apart relation relative to the top surface 602 of the input platform 514 to facilitate access to the substrate by the interface robot 134 (shown in FIGS. 1A–B) or pass through robot 520.

Referring back to FIG. 5, the output platform 516 is disposed in a lower region 522 the transfer station 502 adjacent the first port 508 of the load lock chamber 104. The output platform 516 is generally configured similar to the input platform 514 and is adapted to facilitate wafer transfer between a load lock robot 524 disposed in the load lock chamber 104 and the factory interface robot 134.

The pass through compartment 506 provides a conduit through which substrates may be transferred between the transfer station 502 and the heat treating station 504. The pass through robot 540 is disposed within the pass through compartment 506 to facilitate substrate transfer there through. The pass through robot 520 is generally configured similar to the transfer robot 126 described above, although robot having other configurations or transfer mechanism may be employed to provide substrate transfer through the pass through compartment 506.

An optional door 524 may be provided to selectively close an exit port 526 defined between the pass through compartment 506 and the heat treating station 504. The door 524 may be closed to slow the transfer of heat between the environments of the pass through compartment 506 and the heat treating station 504.

The heat treating station 504 is generally adapted to receive substrates from the pass through robot 520 and move the substrate adjacent the second port 510 of the load lock chamber 104 while thermally treating the substrate. By thermally treating the substrate in the staging system 110 as opposed to thermally treating the substrate in a vacuum environment, an appreciable cost savings is realized due to elimination of hardware suitable to withstand vacuum conditions and an associated savings in factory floor space requirements (e.g., footprint reduction) while reducing process times associated with substrate heating within the processing chambers 108. One heat treatment station that may be adapted to benefit from the invention is described in U.S. Patent Provisional Application Ser. No. 60/259,035, filed Dec. 29, 2000, by Q. Shang, which is hereby incorporated by reference in its entirety.

Figure 7:
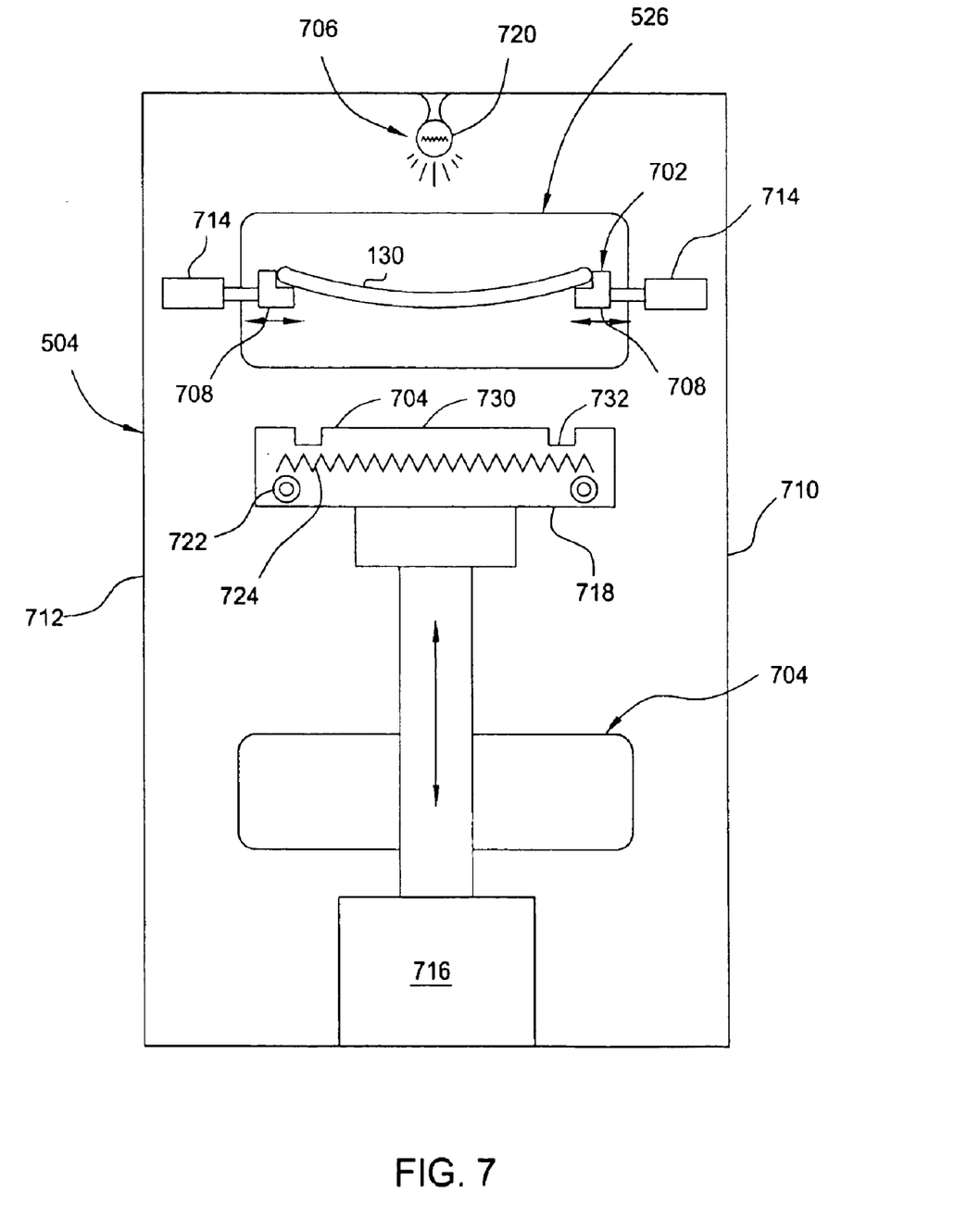
FIG. 7 is a sectional view of one embodiment of the heat treatment station.

FIG. 7 depicts a sectional view of one embodiment of the heat treatment station 504. The heat treating station 504 generally includes a substrate receiving rack 702, a substrate elevator 704 and at least one heating device 706. The substrate receiving rack 702 is typically positioned adjacent the exit port 526 of the pass through compartment 506. The substrate receiving rack 702 is adapted to provide a platform to facilitate the hand off between the pass through robot and the substrate elevator 704. In one embodiment, the substrate receiving rack 702 includes an opposed pair of rails 708 coupled to opposing walls 710, 712 of the heat treatment station. Each rail 708 is coupled to a respective wall 710, 712 by an actuator 714 that controls the spacing between the rails 708. The actuator 714 may position the rails 708 in a first position so that the substrate is supported on the rails 708. The substrate elevator 704 may move between the rails 708 while in the first position to lift the substrate from the rails 708. The actuator 714 may then be actuated to space the rails 708 so that the substrate elevator 704 may be lowered, allowing the substrate to pass between the rails 708. The substrate receiving rack 702 may include alternative configurations that also facilitate substrate transfer between the pass through robot 520 and the substrate elevator 704.

Referring to both FIGS. 5 and 7, the substrate elevator 704 generally includes a main actuator 716 coupled to an elevator plate 718. The main actuator 716 is adapted to control the elevation of the elevator plate 718 so that substrates may be retrieved from the substrate retrieving rack 702 and lowered to a position adjacent the second port 510 of the load lock chamber 104. The main actuator 716 may be a pneumatic cylinder, hydraulic cylinder, a ball screw or other linear actuator that facilitates movement of the substrate in a vertical direction.

The elevator plate 718 is typically fabricated from aluminum or other material having good heat transfer characteristics. A support surface 730 of the elevator plate 718 typically includes one or more channels 732 formed therein that are configured to facilitate transfer of the substrate from the support surface 730 to a robot 530 disposed in the load lock chamber 104. Alternatively, lift pins or fixed supports may be utilized to maintain the substrate in a spaced-apart relation relative to the support surface 730 to facilitate substrate exchange with the load lock robot 530.

The heating device 706 is suitable for heating the substrate 130 to a temperature of about 150 to about 550 degrees Celsius. The heating device 706 comprise one or combinations of a resistive heating element, a radiant lamp, a conduit for flowing a heat transfer fluid therethrough, a thermal electric device or other device for thermally controlling the temperature of the substrate while positioned on the elevator plate 718. In the embodiment depicted in FIG. 7, the heating device 706 includes at least one lamp 720, conduit 722 for flowing a heat transfer fluid, and a resistive element 724. The lamp 720 is typically coupled proximate the rack 702. The conduit 722 and resistive element 724 are typically disposed in or otherwise coupled to the elevator plate 718.

Figure 8:
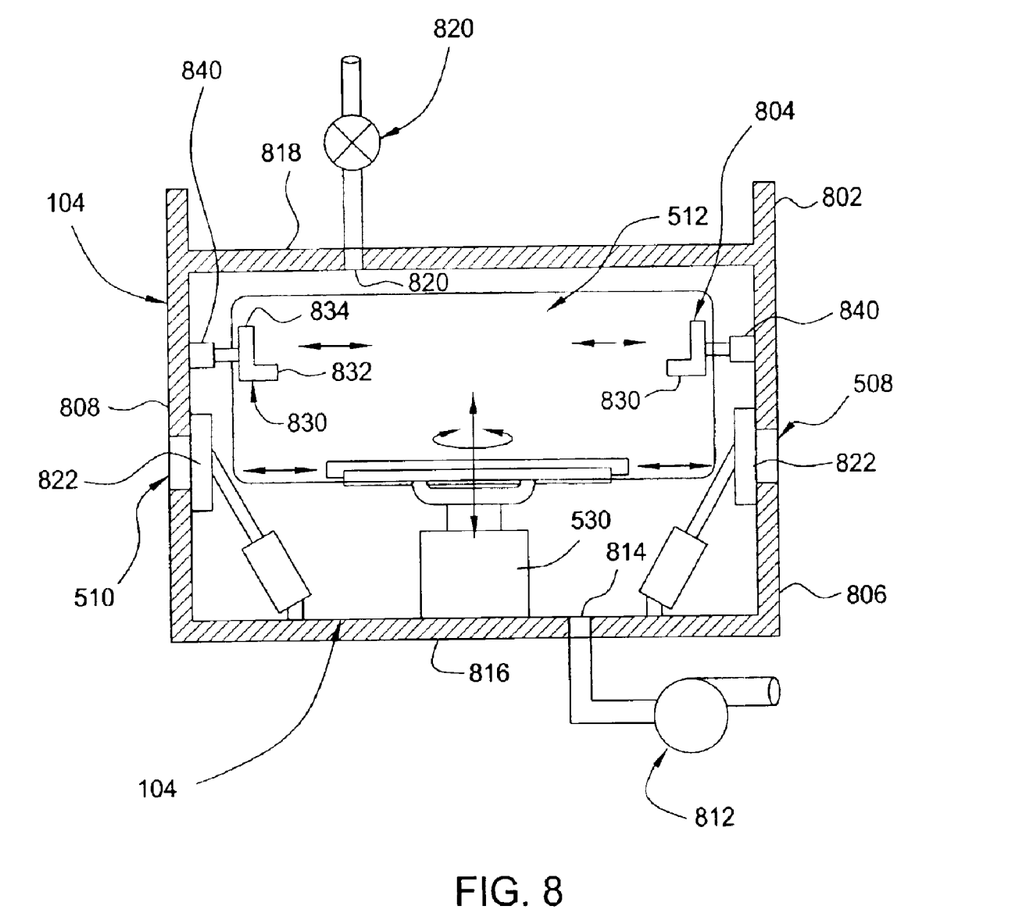
FIG. 8 is a sectional view of one embodiment of the load lock chamber.

FIG. 8 is a sectional view of one embodiment of the load lock chamber 104. The load lock chamber 104 generally includes a chamber body 802 having a substrate receiving rack 804 and the load lock robot 530 disposed therein. The chamber body 802 is typically fabricated from a unitary block of aluminum or welded stainless steel plate. The chamber body 802 includes the first port 508 and second port 510 disposed on opposing walls 806, 808 of the chamber body 802 respectively facing the transfer station 502 and the heat treatment station 504. The third port 512 is formed through a wall 810 of the chamber body 802 disposed between the walls 806, 808 and facing the transfer chamber 106. The ports 508, 510, 512 are selectively sealed by slit valves 822 (two of which are shown to enable viewing of the third port 512) that may be closed to selectively isolate the environment of the load lock chamber 104 from the surrounding stations 502, 504 and transfer chamber 106.

The substrate receiving rack 804 is positioned above the load lock robot 530 and adjacent the third port 512. The substrate receiving rack 804 is adapted to hand off substrates with both the load lock robot 530 and the transfer robot 126. In one embodiment, the substrate receiving rack 804 includes a two pair of opposed rails 830 respectively coupled to the walls 806, 808 above the ports 508, 510.

One or more rail actuators 840 couples each rail 830 to a respective wall 806, 808. The actuators 840 may be a solenoid, pneumatic cylinder, hydraulic cylinder, linear actuator or other device adapted to control the spacing between the rails 830.

Each rail 830 includes a horizontal flange 832 having a vertical lip 834 projecting upwards from the flange 832 proximate each wall 806, 808. Each pair of rails 830 are spaced on the walls 806, 808 so that the corners of the substrate are supported on rails 830 while leaving space between the rails 830 for the end effectors of the robots 530, 126 to pass therebetween. The rails 830, when spaced by the actuators 840 in a first position, are configured to receive a processed substrate from the transfer robot 126. After a substrate is deposited on the rails 830 by the transfer robot 126, the load lock robot 530 is elevated to a position adjacent the third port 512 where the transfer robot 126 directly lifts the substrate from the load lock robot 530 and moves the substrate into the transfer chamber 106 for processing. Typically, the load lock robot 530 rotates the substrate disposed thereon about 90 degrees to properly orientate the substrate prior to handing off the substrate to the transfer robot 126.

The load lock robot 530 is then elevated to pass between the rails 830 to retrieve the processed substrate from the rails 830. The rail actuators 840 move the rails 830 outward to a second position. In the second position, the substrate, now carried by the load lock robot 530, is lowered between the rails 830 and rotated into a position adjacent the fist port 508 where the substrate may be transferred to the transfer station 502 and ultimately returned to the cassettes disposed in the factory interface.

Figure 9:
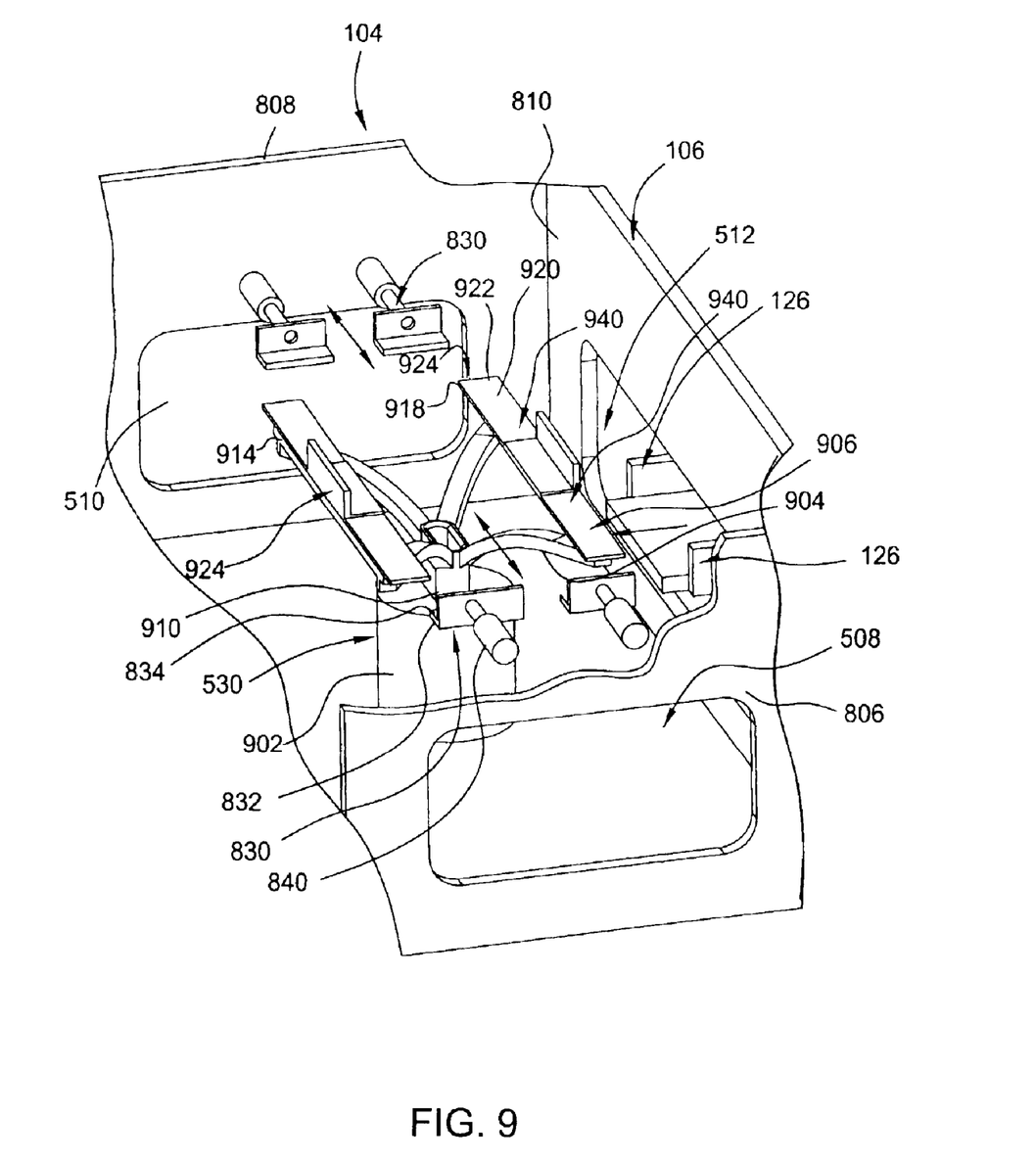
FIG. 9 is a perspective view of one embodiment of a load lock robot disposed in the load lock chamber of FIG. 8.

FIG. 9 is a perspective view of the load lock robot 530 disposed in the load lock chamber 104. The load lock robot 530 is configured similarly to the transfer robot 126 and includes a body 902, a bracket 904 and a linkage assembly 906. The body 902 is centrally coupled to a bottom 908 of the load lock chamber 104 and typically houses a motor (not shown) that is utilized to rotate the bracket 904 and linkage assembly 906.

The bracket 904 couples the linkage assembly 906 to the body 902. In the embodiment depicted in FIG. 9, the bracket 904 is coupled to the body 902 by a shaft 910 that is extended and retracted from the body 902 to control the elevation of the bracket 904 and linkage assembly 906 as needed to position substrates disposed on the linkage assembly proximate the port 508, 510, 512 for substrate exchange and to retrieve substrates from the substrate receiving rack 804.

The linkage assembly 906 generally includes a first actuator, a stage 914, a second actuator and an end-effector 918. The first and second actuators and associated bearings are not shown in FIG. 9 but are similar to those shown in FIGS. 2–4. The first actuator is adapted to move the stage 914 relative to the bracket 904. The second actuator is adapted to move the end-effector 918 relative to the stage 914. The end-effector 918 is adapted to support the substrate (not shown in FIG. 9) while being transported by the load lock robot 530.

In one embodiment, the end-effector 918 includes a pair of substrate supports 924. Each substrate support 924 includes a first or upper flange 920 coupled to a second or lower flange 922. The upper flanges 920 are disposed in a spaced-apart relation configured to capture the substrate therebetween, thus preventing the substrate from falling off of the robot 530 during substrate transfer. The lower flanges 922 extend radially inward from the upper flanges 920 in an L-shaped configuration to support the substrate 920 between the supports 924.

To facilitate direct hand off between the end-effector 218 of the transfer robot 126 and an end-effector 918 of the load lock robot 530, a plurality of notches 940 are formed in the ends of each substrate support 924 of the end-effector 918. Typically, two notches 940 extend completely through the upper flange 920 and at least partially into the lower flange 922 of each substrate support 924. The depth of the notch 940 formed into the lower flange 922 is configured to allow the substrate supports 324 of the end-effector 218 to pass between the end-effector 918 and the substrate supported thereon. As either the end-effector 218 is elevated and/or the end-effector 918 is lowered, the substrate is transferred from the load lock robot 530 to the transfer robot 126. The end-effector 218 of the transfer robot 126 is then retracted, moving the substrate into the transfer chamber 106.

Returning to FIG. 8, a pumping system 812 is coupled to the load lock chamber 104 typically through a port 814 disposed through a bottom 816 of the load lock chamber 104. The pumping system 812 facilitates evacuation of the interior volume of the load lock chamber 104 to a pressure substantially equal to the pressure of the transfer chamber 106 to accommodate substrate exchange therewith without loss of vacuum. A sealable vent 820 is formed through a top 818 of the load lock chamber 104 to selectively allow filtered air to enter the load lock chamber 104 to raise the load lock chamber's pressure to substantially that of the surrounding stations 502, 504 to facilitate substrate transfer with the stations 502, 504.

Referring primarily to FIGS. 1A–B and 5, in operation, the interface robot 134 retrieves a substrate from one of the substrate storage cassettes 130 and transfers the substrate to the input platform 114 of the transfer station 502. The substrate is retrieved by the pass through robot 520 and transferred to the heat treating station 504. Within the heat treating station 504, the substrate is heated to a predetermined temperature, typically between 150 and about 550 degrees Celsius. After heating, the substrate is retrieved from the heat treating station 504 and transferred into the load lock chamber 104 by the load lock robot 530. The load lock chamber 104 is evacuated to a pressure substantially equal to that of the transfer chamber 106. The slit valve closing the third port 512 of the load lock chamber 104 is opened and a processed substrate is transferred from the transfer chamber 106 to the rack by the transfer robot 126. The transfer robot then retrieves the substrate to be processed from the load lock robot 530. The port 512 is closed, and the load lock chamber 104 is vented to substantially equal the pressure of the surrounding stations 502, 504. The load lock robot 530 is elevated to lift the processed substrate off the racks 804. The racks are retracted to allow the substrate now seated on the load lock robot 530 to be lowered to a position proximate the first port 508.

The slit valve closing the first port 508 is opened, and the substrate is transferred by the load lock robot 530 to the output platform 516 of the transfer station 502. The interface robot 134 then retrieves the robot from the output platform 516 and returns the processed substrate to one of the cassettes 132.

While the foregoing is directed to the preferred embodiment of the present invention, other and further embodiments of the invention may be devised without departing from the basic scope thereof, and the scope thereof is determined by the claims that follow.

What is claimed is:

1. A processing system comprising:
    a transfer chamber;
    at least one processing chamber coupled to the transfer chamber, and
    a substrate staging system coupled to the transfer chamber, the staging system comprising:
        a load lock chamber having a first port coupled to the transfer chamber, a second port, and a third port adapted to receive a substrate from a factory interface;
        a load lock robot disposed in the load lock chamber; and
        a heat treating station coupled to the second port of the load lock chamber.

2. The processing system of claim 1, wherein the substrate staging system further comprises:
    a transfer station coupled to the third port of the load lock station; and
    a pass through compartment having a pass through robot disposed therein, the pass through robot adapted to transfer substrates between the transfer station and the heat treatment station.

3. The processing system of claim 2, wherein the pass through robot further comprises:
    a body;
    a stage coupled to the body and adapted to move linearly along a line defined between the transfer station and the heat treating station; and
    an end-effector coupled to the stage and adapted to move linearly relative to the stage along the line defined between the transfer station and the heat treating station.

4. The processing system of claim 2, wherein the pass through compartment is disposed above or below the load lock chamber.

5. The processing system of claim 1, wherein the heat treating station further comprises:
    a substrate receiving rack; and
    a substrate elevator adapted to move substrates from the substrate receiving rack to a position adjacent the second port of the load lock chamber.

6. The processing system of claim 5, wherein the substrate receiving rack further comprises:
    a first rail;
    a second rail disposed in a spaced-apart relation relative to the first rail;
    a first actuator coupled to the first rail; and
    a second actuator coupled to the second rail, the first actuator and the second actuator controlling a distance defined between the first and second rails.

7. The processing system of claim 5, wherein the substrate elevator further comprises:
    a plate adapted to support the substrate thereon; and
    an actuator coupled to the plate.

8. The processing system of claim 7, wherein the plate further comprises:
    a support surface having one or more channels formed therein.

9. The processing system of claim 1, wherein the heat treating station further comprises:
    at least one heating device suitable for heating a substrate disposed on at least one of the substrate receiving rack or a substrate elevator that is adapted to move substrates from the at least one substrate receiving rack to a position adjacent the second port of the load lock chamber.

10. The processing system of claim 9, wherein the at least one heating device is selected from the group consisting of a resistive heating element, a radiant lamp, a conduit for flowing a heat transfer fluid therethrough, a thermal electric device or combinations thereof.

11. The processing system of claim 9, wherein the at least one heating device heats is adapted to heat the substrate disposed in the heat treating station to a temperature between about 150 and 550 degrees Celsius.

12. The processing system of claim 1, wherein the third port is disposed opposite the second port and orthogonal to the first port.

13. The processing system of claim 12, wherein the load lock chamber further comprises:
    a first rail disposed adjacent the first port above the load lock robot;
    a second rail disposed in a horizontal spaced-apart relation relative to the first rail;
    a first actuator coupled to the first rail; and
    a second actuator coupled to the second rail, the first actuator and the second actuator controlling a distance between the first and second rails.

14. The processing system of claim 13, wherein the load lock robot further comprises:
    a body;
    a stage coupled to the body and adapted to move linearly along a line defined between the second port and the third port; and
    an end-effector coupled to the stage and adapted to move linearly relative to the stage along the line defined between the second port and the third port, the end-effector adapted to move between an upper elevation defined between the first and second rails and a lower elevation.

15. The processing system of claim 12, wherein the transfer station further comprises:
    an output platform disposed adjacent the third port of the load lock chamber; and
    an input platform disposed above the output platform.

16. The processing system of claim 15, wherein the input platform further comprises:
    a support surface adapted to support a substrate;
    one or more first channels formed in the support surface; and
    one or more second channels formed in the support surface, wherein the second channels are orthogonal to the first channels.

17. The processing system of claim 1, further comprising:
a factory interface disposed adjacent the substrate staging system; and
an interface robot disposed in the factory interface adapted transfer substrates between the factory interface and the transfer station.

18. The processing system of claim 1, wherein the transfer chamber further comprises:
a robot body;
a base coupled to and adapted to rotate about the robot body;
a stage coupled to the base and adapted to move in a first direction substantially perpendicular to an axis of rotation of the stage; and
an end-effector coupled to the stage and adapted to move in the first direction.

19. A processing system comprising:
a transfer chamber;
at least one processing chamber coupled to the transfer chamber; and
a substrate staging system coupled to the transfer chamber, the staging system comprising:
a transfer station;
a heat treating station;
a load look chamber having a first port coupled to the transfer station, a second port coupled to the heat treating station, and a third port coupled to the transfer chamber; and
a pass through compartment coupling the transfer station and the load lock chamber.

20. The processing system of claim 19 further comprising:
a first robot disposed in the pass through compartment and adapted to transfer substrates between an input platform disposed in the transfer station and a first substrate receiving rack disposed in the heat treating station;
a second robot disposed in the load lock chamber and adapted to transfer substrates between a second substrate receiving rack disposed in the load lock chamber, an output platform disposed in the transfer station and the heat treating station; and
a third robot disposed in the transfer chamber and adapted to transfer substrates from the second substrate receiving rack and the at least one processing chamber.

21. The processing system of claim 20, wherein the heat treating station further comprises:
a substrate elevator adapted to move substrates from the first substrate receiving rack and a position adjacent the second port of the load lock chamber.

22. The processing system of claim 21, wherein the first substrate receiving rack further comprises:
a first rail;
a second rail disposed in a spaced-apart relation to the first rail;
a first actuator coupled to the first rail; and
a second actuator coupled to the second rail, the first actuator and the second actuator controlling a distance between the first and second rails to selectively allow the substrate elevator therebetween.

23. The processing system of claim 21, wherein the substrate elevator further comprises:
a plate having one or more channels formed therein and adapted to support the substrate thereon; and
an actuator coupled to the plate.

24. The processing system of claim 21, wherein the heat treating station further comprises:
at least one heating device suitable for heating a substrate disposed on at least one of the substrate receiving rack or the substrate elevator.

25. The processing system of claim 24, wherein the at least one heating device is selected from the group consisting of a resistive heating element, a radiant lamp, a conduit for flowing a heat transfer fluid therethrough, a thermal electric device or combinations thereof.

26. The processing system of claim 24, wherein the at least one heating device adapted to heat the substrate disposed in the heat treating station to a temperature between about 150 and 550 degrees Celsius.

27. A method of processing a substrate in a processing system, comprising:
transferring a substrate from a storage cassette to an input platform of a staging system;
transferring the substrate from the input platform to a substrate support disposed in the heat treating station;
heat treating the substrate within the heat treating station;
transferring the substrate from the substrate support disposed in the heat treating station to a load lock chamber;
transferring the substrate from the load lock chamber to a transfer chamber; and
processing the substrate in a processing chamber coupled to the transfer chamber.

28. The method of claim 27, wherein the step of heat treating comprises:
heating the substrate to a temperature between about 150 to about 550 degrees Celsius.

29. The method of claim 27, wherein the step of heat treating comprises:
moving the substrate to an elevation proximate a port of the load lock chamber.

30. The method of claim 29, wherein the step of moving the substrate further comprises:
moving a substrate support plate between a pair of rails supporting the substrate;
transferring the substrate from the rails to the plate;
spacing the rails to clear the substrate supported on the plate; and
lowering the plate supporting the substrate.

31. The method of claim 27, wherein the step of transferring the substrate from the input platform to the heat treating station comprises:
passing the substrate above or below the load lock chamber.

32. The method of claim 27, further comprising:
transferring a processed substrate from the transfer chamber to a substrate receiving rack disposed in the load lock chamber;
moving the processed substrate from the substrate receiving rack to a second position; and
transferring the processed substrate from the second position through a port of the load lock chamber to an output platform of the staging system.

33. The method of claim 32, wherein the step of transferring processed substrate to the output platform comprise moving the substrate in a direction orthogonal to a movement of the processed substrate between the transfer chamber and the substrate receiving rack.

34. The method of claim 27, wherein the step of transferring the substrate from the heat treating station to the load lock chamber comprises moving the substrate in a direction orthogonal to a movement of the processed substrate between the transfer chamber and the load lock chamber.

* * * * *

UNITED STATES PATENT AND TRADEMARK OFFICE
CERTIFICATE OF CORRECTION

PATENT NO. : 6,896,513 B2
DATED : May 24, 2005
INVENTOR(S) : Bachrach et al.

It is certified that error appears in the above-identified patent and that said Letters Patent is hereby corrected as shown below:

Title page,
Item [56], References Cited, U.S. PATENT DOCUMENTS,
delete "414/22.13" and insert -- 414/416 --.

Column 1,
Line 29, delete "$1^{1/2}$" and insert -- 1-1/2 --.

Column 2,
Line 13, delete "is a" before "side".

Column 9,
Line 20, after "chamber" delete "," and insert -- ; --.
Line 27, delete "look" and insert -- lock --.

Column 10,
Line 25, after "device" delete "heats".

Column 11,
Line 25, delete "look" and insert -- lock --.

Signed and Sealed this

Fourteenth Day of February, 2006

JON W. DUDAS
*Director of the United States Patent and Trademark Office*